United States Patent
Kuroda

[19]

[11] Patent Number: 5,986,312
[45] Date of Patent: Nov. 16, 1999

[54] FIELD EFFECT SEMICONDUCTOR DEVICE HAVING IMPROVED CONNECTIONS

[75] Inventor: Hideaki Kuroda, Kanagawa, Japan

[73] Assignee: Sony Corporation, Tokyo, Japan

[21] Appl. No.: 08/922,876

[22] Filed: Sep. 3, 1997

Related U.S. Application Data

[63] Continuation of application No. 08/597,872, Feb. 7, 1996, abandoned.

[30] Foreign Application Priority Data

Feb. 7, 1995 [JP] Japan .................................. 7-042412

[51] Int. Cl.$^6$ .................................................... H01L 29/78
[52] U.S. Cl. ............................ 257/382; 257/384; 257/412
[58] Field of Search .................................. 257/382, 383, 257/384, 388, 408, 412, 413, 336, 344

[56] References Cited

U.S. PATENT DOCUMENTS

| | | | |
|---|---|---|---|
| 5,113,234 | 5/1992 | Furuta et al. ............................ | 257/384 |
| 5,223,456 | 6/1993 | Malwah ................................... | 257/384 |
| 5,294,822 | 3/1994 | Verrett ..................................... | 257/382 |
| 5,384,485 | 1/1995 | Nishida et al. .......................... | 257/382 |
| 5,701,029 | 12/1997 | Sasaki ...................................... | 257/377 |
| 5,736,770 | 4/1998 | Asai et al. ............................... | 257/384 |

*Primary Examiner*—David B. Hardy
*Attorney, Agent, or Firm*—Hill & Simpson

[57] ABSTRACT

In a field effect semiconductor device, in order to increase the operation speed and to make the device finer by lowering the sheet resistance, and to lower the production cost by reducing the process steps, the diffusion layer 17 is surrounded by $SiO_2$ films 16 and 34 covering the tungsten polycide layer 35 provided as the gate electrode and by the $SiO_2$ film 12 in the device isolating region, and the titanium polycide layer 44 is brought into contact with the entire surface of the diffusion layer 17 while being extended on the $SiO_2$ films 12 an d 16. Accordingly, a large allowance in aligning the contact hole 25 with respect to the titanium polycide layer 44 can be assured to make the contact compensation ion implantation unnecessary.

7 Claims, 4 Drawing Sheets

FIELD EFFECT SEMICONDUCTOR DEVICE HAVING IMPROVED CONNECTIONS

This is a continuation of application Ser. No. 08/597,872, filed Feb. 7, 1996, now abandoned.

BACKGROUND OF THE INVENTION

The present invention relates to a field effect semiconductor device comprising a gate electrode and a diffusion layer, and to a process for fabricating the same.

In LSI's such as MPU's of which high speed operation is required, it is necessary to reduce the parasitic resistance by converting the diffusion layer of the field effect semiconductor device into suicides. FIG. 3 shows a process for fabricating a MOS transistor according to a first example previously suggested, in which the diffusion layer is converted into silicide.

In the first example referring to FIG. 3A, an $SiO_2$ film 12 is formed on the surface of an isolating region of a Si substrate 11 by means of LOCOS process and the like, and another $SiO_2$ film 13 is formed on the surface of the active region surrounded by the $SiO_2$ film 12. Then, after forming a gate electrode using the impurity-doped polycrystalline Si film 14, implantation of impurity ions is effected by using the polycrystalline Si film 14 and the $SiO_2$ film 12 as masks to form a lightly-doped diffusion layer 15.

After forming side walls made of an $SiO_2$ film 16 or an SiN film and the like on the side of the polycrystalline Si film 14, a diffusion layer 17 containing impurity at a high concentration is formed by means of implantation of impurities ions using the polycrystalline Si film 14 and the $SiO_2$ films 16 and 12 as masks. Then, Ti film 21 or Co film and the like is deposited over the entire surface.

Referring to FIG. 3B, the Si substrate 11 exposed where not masked by the $SiO_2$ films 12 and 16 and the polycrystalline Si film 14 are reacted with the Ti film 21 or the like by means of annealing in the temperature range of from 600 to 800° C. to form a $TiSi_2$ film 22 or a $CoSi_2$ film and the like. As a result, a titanium polycide layer 23 comprising the polycrystalline Si film 14 and the $TiSi_2$ film 22 provides the gate electrode. Then the Ti film 21 and the like which remain non-reacted on the $SiO_2$ films 12 and 16 are removed.

Referring to FIG. 3C, an interlayer, insulating film 24 is formed, and a contact hole 25 which reaches the $TiSi_2$ film 22 provided on the surface of the diffusion layer 17 is formed in the interlayer insulating film 24. If the contact hole 25 should be misaligned from the $TiSi_2$ film 22, the contact resistance becomes too high because the bird's beak of the $SiO_2$ film 12 is etched as shown in FIG. 3C as to expose the portion of the Si substrate 11 having no diffusion layer 17 formed thereon.

Accordingly, an impurity 26 is introduced into the Si substrate 11 by means of contact compensation ion implantation to newly form a diffusion layer 27 (FIG. 3D). Then, referring to FIG. 3D, the contact hole 25 is filled with a tungsten plug 31, an interconnection is formed with an Al film 32, and a passivation film (not shown in the figure) is formed to obtain a complete MOS transistor of an LDD structure.

FIG. 4 shows a fabrication process of the first half of a second example previously suggested. In the process referring to FIG. 4A, a polycrystalline Si film 14, a $WSi_x$ film 33, and an $SiO_2$ film 34 are processed into a pattern of a gate electrode as to form a gate electrode of a tungsten polycide layer 35 comprising the polycrystalline Si film 14 and the $WSi_x$ film 33. Then, referring to FIG. 4B, substantially the same process steps as those of the first example shown with reference to FIG. 3 are effected, except that the $TiSi_2$ film 22 is formed only on the surface of the diffusion layer 17.

However, in both of the first and second examples above, the surface portion of the Si substrate 11 itself is converted into a silicide to form the $TiSi_2$ film 22 on the surface of the diffusion layer 17. This induces high stress that is applied to the Si substrate 11, and particularly, to the Si substrate 11 in the vicinity of the bird's beak of the $SiO_2$ film. Thus, crystal defects are found apt to form on the Si substrate 11, and in case the diffusion layer 17 is shallow, a junction leak current is likely to generate in the diffusion layer 17.

The junction leak current attributed to crystal defects can be prevented from occurring by deepening the diffusion layer 17 in such a manner that the crystal defects are included in the diffusion layer 17. However, if the diffusion layer 17 should be provided deep, it becomes difficult to suppress the short channel effect to make a fine MOS transistor unfeasible.

Furthermore, in case the diffusion layer 17 is provided deep as is shown in FIG. 5 when a diffusion layer 36 is provided as the so-called pocket layer, the position if the junction of the diffusion layer 17 cannot be determined, but varies in the longitudinal direction of the channel due to the variation in the width of the $SiO_2$ film 16 provided as the side wall. This leads to the variation in width of the diffusion layer 36. Thus, as is clearly understood from FIG. 5, the shape of the depletion layer 37 also varies to make the threshold voltage undecided.

Furthermore, in CMOS transistors, although contact compensation ion implantation is performed to cope with the case the contact hole 25 is misaligned from the $TiSi_2$ film as shown in FIG. 3C, an additional lithography step is required to cover the MOS transistor having the opposite conductive type. Accordingly, the number of process steps increases as a whole to elevate the cost of fabrication.

Furthermore, annealing at a temperature of 800° C. or higher is necessary to activate the impurity 26 introduced by contact compensation ion implantation. However, at this process stage, the $TiSi_2$ film 22 is already formed. Thus, the annealing grows and isolates the crystal grains in the $TiSi_2$ film as to lead to a problematic increase in the resistance of the $TiSi_2$ film 22.

To prevent the contact holes 25 from the misalignment with respect to the $TiSi_2$ film, the distance between the contact hole 25 and the $SiO_2$ film 12 may be increased by expanding the area of the element active region. But this means is in conflict with the aim of implementing a finer MOS transistor.

SUMMARY OF THE INVENTION

The field effect semiconductor device according to the present invention is characterized by a field effect semiconductor device having a semiconductor substrate; a diffusion layer formed in a surface of the semiconductor substrate; an isolation region formed on the semiconductor substrate to surround the diffusion layer; a gate electrode formed on the semiconductor substrate; an insulating film covering the gate electrode; and an electrically conductive layer formed on the entire surface of the diffusion layer to make a contact with the diffusion layer, said electrically conductive layer comprising a silicide layer on at least the surface portion thereof and extending over the insulating film and the isolation region.

The process for fabricating a field effect semiconductor device according to the invention is characterized by the steps of providing a semiconductor substrate having a doped region formed in a surface of the semiconductor substrate; an insulating region formed on the semiconductor substrate to surround the doped region, a gate electrode formed on the semiconductor substrate, and an insulating film which covers the gate electrode; forming a semiconductor film on the doped region to extend over the insulating film and the isolation region; and converting at least the surface portion of the semiconductor film into a silicide layer.

The process for fabricating a field effect semiconductor device according to the invention is characterized in that the process further comprises a step of introducing an impurity into the semiconductor film and the region to form a diffusion layer in the region.

The process for fabricating a field effect semiconductor device according to the invention is characterized in that the process further comprises a step of processing the electrically conductive layer for forming the gate electrode and the first insulating film superposed on the electrically conductive layer into the pattern of the gate electrode; and a step of forming a side wall comprising a second insulating film on the sides of the electrically conductive layer and the first insulating film, wherein the first and second insulating films are made into the insulating films covering the gate electrode.

In the field effect semiconductor device according to the invention, the electrically conductive layer having a silicide film on at least the surface portion is brought into contact with the entire surface of the diffusion layer. Thus, the sheet resistance of the diffusion layer is lowered.

Furthermore, because the electrically conductive layer is extended over the insulating film covering the gate electrode and the isolating region, and because the electrically conductive layer is larger in area than the diffusion layer, as compared with the case of perforating a contact hole toward the $TiSi_2$ film on the diffusion layer both of which are in contact with the bird's beak of the $SiO_2$ film, the margin of alignment can be taken larger in forming the contact hole in the electrically conductive layer. Furthermore, the contact compensation ion implantation can be eliminated because the allowance of alignment is larger in forming the contact hole with respect to the electrically conductive layer.

According to the process for fabricating a field effect semiconductor device according to the invention, at least the surface portion of the semiconductor film, which covers the region surrounded by the insulating films covering the gate electrode and by the isolating region, is made of a silicide film, but the surface portion of the semiconductor substrate itself is not converted into a silicide film. Thus, crystal defects are less apt to generate on the semiconductor substrate because the stress applied to the semiconductor substrate 11 is sufficiently small.

In accordance with the process for fabricating a field effect semiconductor device according to the invention, an impurity is introduced into the region, which is surrounded by the insulating films covering the gate electrode and by the isolating region, and into the semiconductor film covering the region defined above and the like to form a diffusion layer. Thus, the diffusion layer can be provided shallower by a thickness corresponding to the film thickness of the semiconductor film as compared with the case of directly introducing an impurity into the semiconductor substrate. Furthermore, because the semiconductor film is also used for forming the silicide film, a shallower diffusion layer can be provided without increasing the steps of fabrication.

According to the process for fabricating a field effect semiconductor device according to the invention, the insulating films covering the gate electrode can be formed in a self-aligned manner with respect to the gate electrode. Thus, the diffusion layer can be brought in the vicinity of the channel region as to reduce the resistance between the diffusion layer and the channel region.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

An embodiment of the present invention which is applied to a CMOS transistor having a LDD structure is described below with reference to FIGS. 1 and 2. In FIGS. 1 and 2, the structural components of the embodiment of the present invention corresponding to those in the examples shown in FIGS. 3 to 5 are indicated with the same symbol.

Figure 1A:
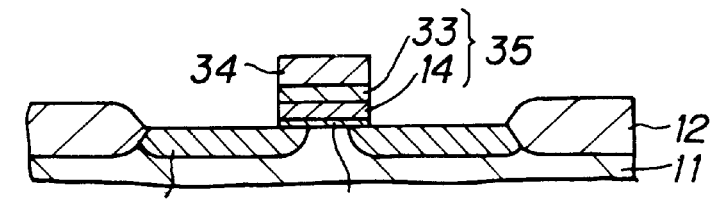
FIGS. 1A–1E are side cross sectional views of a MOS transistor according to an embodiment of the present invention, shown by the process steps.
Figure 2:
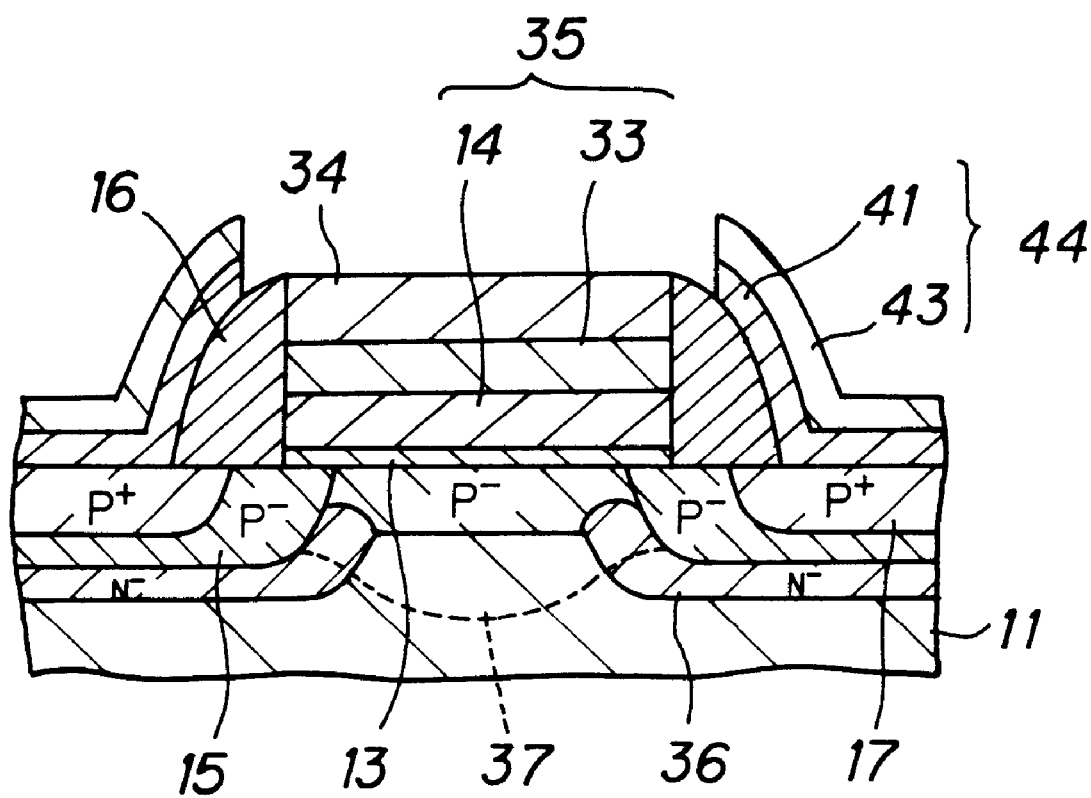
FIG. 2 is a side cross sectional view of a MOS transistor according to another embodiment of the present invention.
Figure 3A:
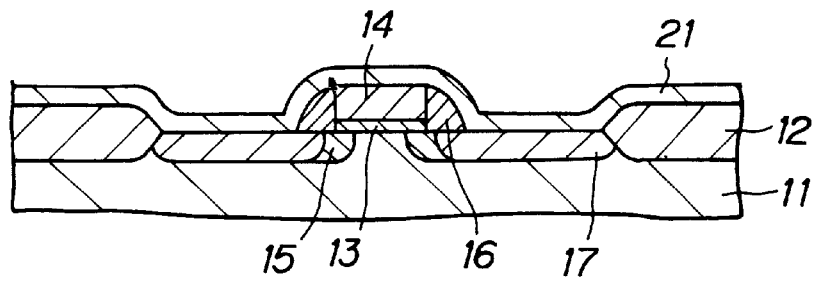
FIGS. 3A–3D are side cross sectional views of a MOS transistor according to a first example previously suggested, shown by the process steps.
Figure 3B:
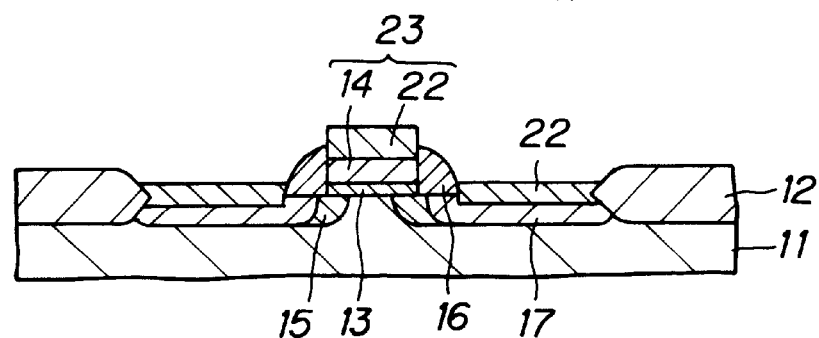
Figure 3C:
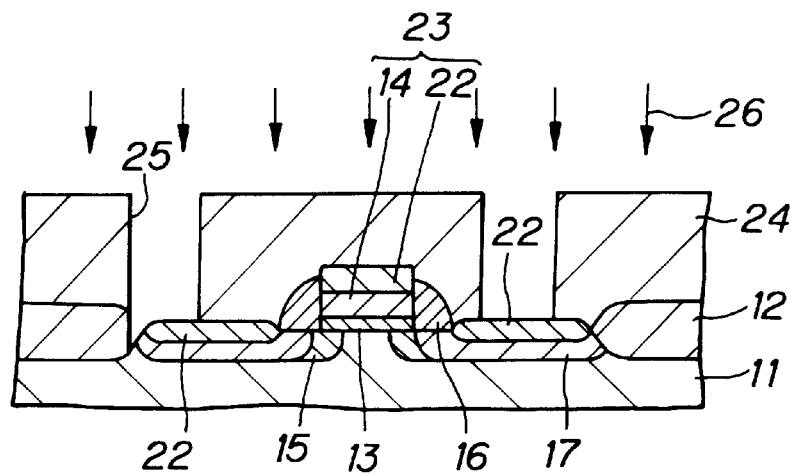
Figure 3D:
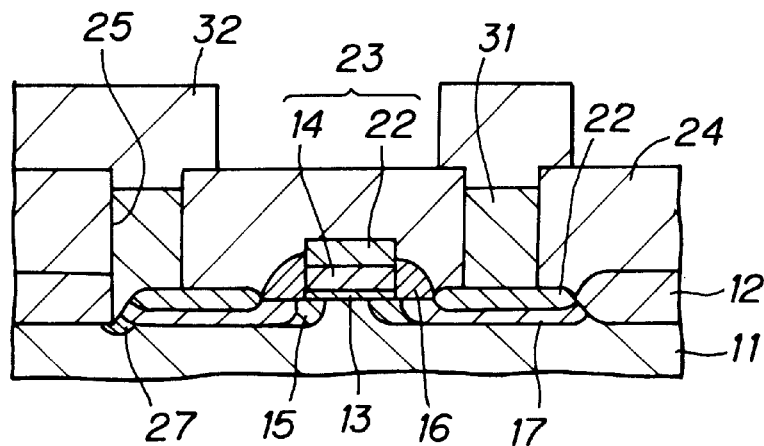
Figure 4A:
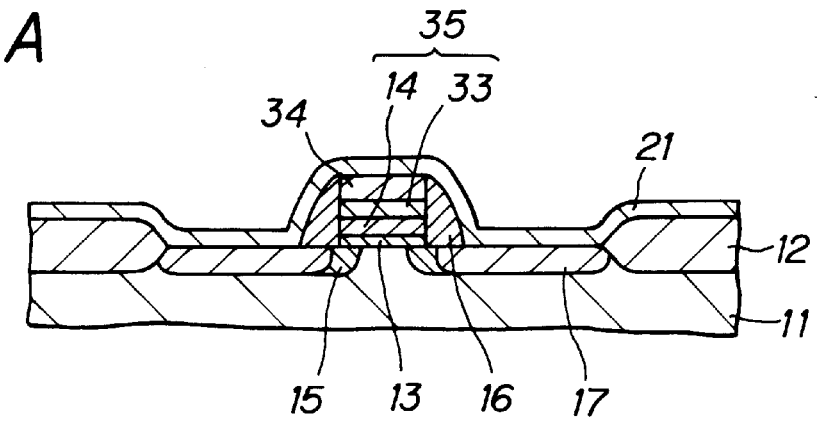
FIGS. 4A and 4B are side cross sectional views of a MOS transistor according to a second example previously suggested, shown by the steps in the first half of the process.
Figure 4B:
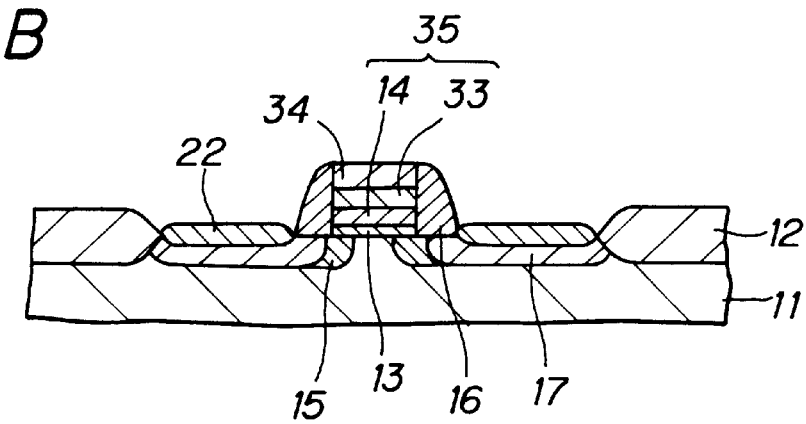
Figure 5:
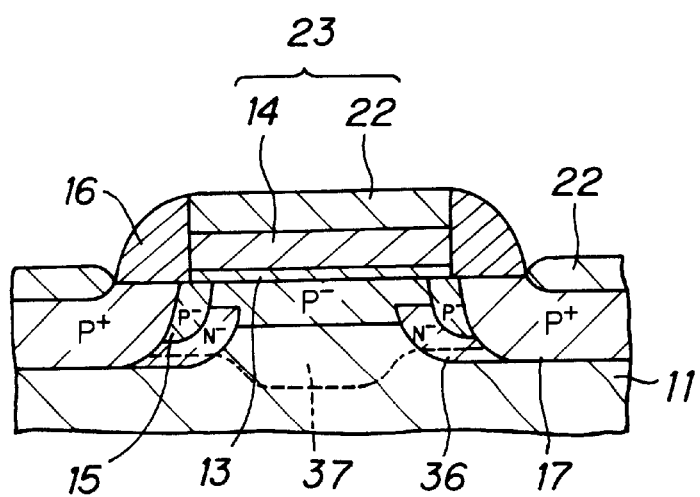
FIG. 5. is a side cross sectional view of a modified MOS transistor according to the first and the second examples previously suggested.

Referring to FIG. 1A, the process steps of patterning the impurity-doped polycrystalline Si film 14, the $WSi_x$ film 33 and the $SiO_2$ film 34 into a gate electrode to form a gate electrode with a tungsten polycide layer 35 comprising a polycrystalline Si film 14 and a $WSi_x$ film 33 are substantially the same as those described in the second example with reference to FIG. 4.

Then, impurity ions are implanted into the Si substrate 11 by using a resist (not shown in the figure) covering the MOS transistor region of the opposite conductive type and the $SiO_2$ films 34 and 12 as masks to form a lightly-doped diffusion layer 15. For the impurities, $As^+$ or $Phos^+$ ions accelerated at an energy of several tens of keV are used for the NMOS transistor region, while $B^+$ or $BF_{2+}$ ions accelerated at an energy of several to several tens of KeV are used for the PMOS transistor region. The impurity ions for the both transistor regions are implanted at a dose in a range from $10^{12}$ to $10^{14}$ $cm^{-2}$.

Figure 1B:
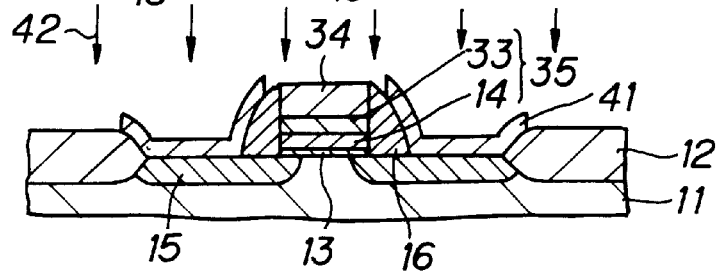

Referring to FIG. 1B, an $SiO_2$ film 16 or an SiN film and the like is deposited thereafter to a thickness in a range from several tens to several hundred nanometers by means of CVD, and the entire surface of the $SiO_2$ film 16 or the like is etched back to form a side wall comprising the $SiO_2$ film 16 and the like on the sides of the tungsten polycide layer 35 and the $SiO_2$ film 34.

Then, a polycrystalline Si film 41 is deposited by means of reduced pressure CVD to a film thickness in a range from several tens to several hundreds nanometers, so that it may be contacted with the Si substrate 11 exposed in a state surrounded by $SiO_2$ films 12 and 16. At the same time, the polycrystalline Si film 41 is processed into a pattern which extends over the SiO₂ film 16 and in the vicinity of the bird's beak of the SiO₂ film 12. There is no particular limitation on the temperature for depositing the polycrystalline Si film 41 by reduced pressure CVD, and an amorphous Si film may be deposited at a temperature not higher than 600° C.

Then, impurity ions 42 are implanted into the polycrystalline Si film 41 and the Si substrate 11 by using a resist (not shown in the figure) covering the MOS transistor region of the opposite conductive type and the SiO₂ films 34, 16 and 12 as masks. For the impurity ions 42, As⁺or Phos⁺ions are used for the NMOS transistor region, while B⁺or $BF_{2+}$ions are used for the PMOS transistor region. The impurity ions for both transistor regions are implanted at an accelerating energy of several tens of keV with a dose in a range from $10^{15}$ to $10^{16}$ cm⁻².

Figure 1C:
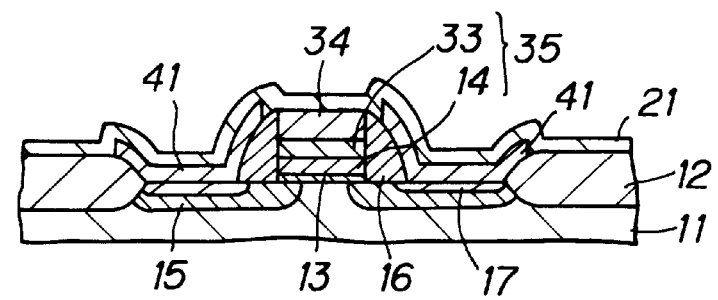

Referring to FIG. 1C, a refractory metal film such as a Ti film or a Co film is deposited on the entire surface to a thickness in a range from several tens to several hundred nanometers by means of sputtering, preferably, collimated sputtering, or CVD. A heavily-doped diffusion layer 17 is formed by the impurity ions 42 which are directly implanted into the Si substrate 11 and the impurity ions 42 which were once implanted into the polycrystalline Si film 41 before diffusing into the Si substrate 11 by solid phase diffusion.

Figure 1D:
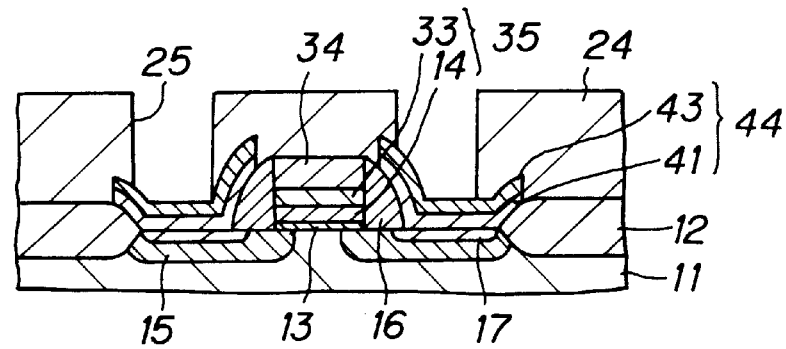

Then, referring to FIG. 1D, the polycrystalline Si film 41 and the Ti film 21 and the like are reacted by annealing in a temperature range from 600 to 800° C. to form a TiSi₂ film 43 or a CoSi₂ film and the like on the surface portion of the polycrystalline Si film 41. As a result, a titanium polycide layer 44 comprising the polycrystalline Si film 41 and the TiSi₂ film 43 is formed. The Ti film 21 and the like which remains non-reacted on SiO₂ films 12, 16, and 34 are removed by etching using ammonium peroxide and the like.

An interlayer insulating film 24 is formed thereafter, through which a contact hole 25 is formed to the titanium polycide layer 44. The titanium polycide layer 44 is larger in area than the diffusion layer 17 because it is extended over the SiO₂ film 16 and in the vicinity of the bird's beak of the SiO₂ film 12 in the same manner as the polycrystalline Si film 41. Accordingly, the alignment allowance of the contact hole 25 in the case of the present example is larger than those in the first and the second examples shown in FIGS. 3 and 4, and no contact compensation ion implantation is effected.

Figure 1E:
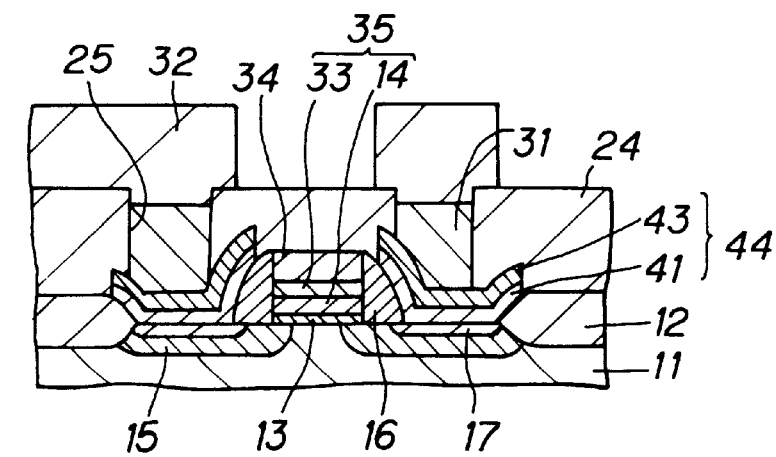

Then, as is shown in FIG. 1E, the contact hole 25 is filled with a tungsten plug 31, and an interconnection is formed with an Al film 32. A passivation film (not shown in the figure) and the like is formed to complete a CMOS transistor having a LDD structure.

In the embodiment described in the foregoing, a new step of lithography for patterning the polycrystalline Si film 41 is necessary when compared with the first and the second examples shown in FIGS. 3 and 4. However, because the step of contact compensation ion implantation can be eliminated, the two steps of lithography for covering the MOS transistor region if the opposite conductive type can also be discarded.

Thus, as a whole, one step of lithography is cut off. Particularly, turnaround time can be shortened in case the CMOS transistor constitutes a gate array, because two steps of lithography are eliminated in the process after forming the contact hole 25 for custom use.

In the embodiment, the surface portion of the polycrystalline Si film 41 is converted into a TiSi₂ film 43 without converting the surface portion of the semiconductor substrate 11 itself into a TiSi₂ film 22. Thus, crystal defects are less apt to generate on the semiconductor substrate 11 because the stress applied to the semiconductor substrate 11 is sufficiently small. Accordingly, a shallow diffusion layer 17 can be formed as is shown in FIG. 1E.

When a MOS transistor having a diffusion layer 36 provided as a pocket layer as shown in FIG. 2 is formed so as to suppress the short-channel effects, it is not necessary to form a deeper diffusion layer as shown in FIG. 5. Thus, the width of the diffusion layer does not vary even though the position of the junction of the diffusion layer 17 is varied in the longitudinal direction of the channel due to the variation in width of the SiO₂ film provided as the side wall. As is clear from FIG. 2, the shape of the depletion layer 37 is not varied to keep the threshold voltage constant. Formation of the pocket layer is accomplished by means of ion implantation of opposite conductivity type as that of the diffusion layer 15 and 17. The ion implantation may be performed with, before, or after an ion implantation for forming the layer 15.

In the example above, the entire surface of the deposited SiO₂ film 16 is etched back at the same time the SiO₂ film 34 is processed into a pattern of the gate electrode. Thus, the SiO₂ films 16 and 34 cover the tungsten polycide layer 35 as the gate electrode in a selfaligned manner.

However, the tungsten polycide layer 35 need not be covered by the SiO₂ film in a self-aligned manner, and the portion of the deposited SiO₂ film which is later used to provide the diffusion layer 17 may be selectively etched. If the bird's beak should be etched due to the misalignment of the mask, contact compensation occurs automatically because the diffusion layer 17 is formed also by the impurity 42 diffused from the polycrystalline Si film 41 by solid phase diffusion.

In the above embodiment, only the surface portion of the polycrystalline Si film 41 is converted into a TiSi₂ film 43. However, the polycrystalline Si film 41 may be entirely converted into a TiSi₂ film 43.

The field effect semiconductor device of the present invention operates at a high speed because the sheet resistance of the diffusion layer is low. Moreover, the large alignment allowance in forming a contact hole through the electrically conductive layer allows fabricating finer devices. Furthermore, because contact compensation ion implantation is unnecessary, the steps of the fabrication process can be minimized and hence, the production cost can be reduced.

The process for fabricating a field effect semiconductor device according to the present invention enables a fine and fast field effect semiconductor device, because, although the sheet resistance of the diffusion layer is lowered by bringing an electrically conductive layer comprising a silicide film on at least the surface portion thereof in contact with the entire surface of the diffusion layer, fewer crystal defects generate on the semiconductor substrate and less junction leakage occurs even in case a shallower diffusion layer is provided.

The process for fabricating a field effect semiconductor device according to the present invention enables the provision of a shallower diffusion layer without increasing the process steps. Accordingly, a finer field effect semiconductor device can be fabricated without increasing the cost of production.

The process for fabricating a field effect semiconductor device according to the present invention provides a field effect semiconductor device further improved for high speed operation, because the diffusion layer can be brought nearer to the channel region, to reduce the resistance between the diffusion layer and the channel region.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A field effect semiconductor device, comprising:
   a semiconductor substrate;
   a diffusion layer formed in a surface of the semiconductor substrate;
   an isolation region formed on the semiconductor substrate to surround the diffusion layer;
   a gate electrode formed on the semiconductor substrate;
   a side-wall insulating film covering a side of the gate electrode; and
   a first electrically conductive layer formed on an entire exposed surface of the diffusion layer to make a contact with the diffusion layer, said first electrically conductive layer comprising a second electrically conductive layer of a silicide layer on at least the surface portion thereof and said first and second electrically conductive layers extending over the side-wall insulating film and at least an edge of the isolation region and each of said layers being above the surface of the substrate;
   an interlayer insulation film having a contact hole formed on said diffusion layer;
   an interconnection formed on said interlayer insulating film: and further wherein a top surface of the semiconductor substrate at the diffusion layer is not formed into a silicide.

2. The field effect semiconductor device as claimed in claim 1, wherein said insulating film comprises a sidewall and an insulating layer formed on a top of the gate electrode.

3. The field effect semiconductor device as claimed in claim 1, wherein said electrically conductive layer includes a semiconductor layer under the silicide layer.

4. The field effect semiconductor device as claimed in claim 3, wherein said semiconductor layer comprises doped polycrystalline silicon.

5. The field effect semiconductor devices as claimed in claim 1, wherein said gate electrode has a polycide structure.

6. The field effect semiconductor device as claimed in claim 1, wherein said diffusion layer has an LDD structure.

7. The field effect semiconductor device as claimed in claim 1, further comprising a pocket layer formed under the diffusion layer.

* * * * *